(12) United States Patent
Dolinsky et al.

(10) Patent No.: US 9,575,191 B2
(45) Date of Patent: Feb. 21, 2017

(54) SOLID STATE PHOTOMULTIPLIER

(71) Applicant: GENERAL ELECTRIC COMPANY, Schenectady, NY (US)

(72) Inventors: Sergei Ivanovich Dolinsky, Clifton Park, NY (US); David Leo McDaniel, Dousman, WI (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 15/174,122

(22) Filed: Jun. 6, 2016

(65) Prior Publication Data

US 2016/0356899 A1 Dec. 8, 2016

Related U.S. Application Data

(60) Provisional application No. 62/171,291, filed on Jun. 5, 2015.

(51) Int. Cl.
| | |
|---|---|
| *G01J 1/20* | (2006.01) |
| *G01T 1/24* | (2006.01) |
| *G01T 1/20* | (2006.01) |
| *H01L 31/115* | (2006.01) |
| *H01L 27/144* | (2006.01) |
| *H01L 27/146* | (2006.01) |
| *G01T 1/208* | (2006.01) |

(52) U.S. Cl.
CPC ............... *G01T 1/248* (2013.01); *G01T 1/201* (2013.01); *G01T 1/208* (2013.01); *G01T 1/2018* (2013.01); *G01T 1/249* (2013.01); *H01L 27/1443* (2013.01); *H01L 27/14612* (2013.01); *H01L 27/14636* (2013.01); *H01L 27/14663* (2013.01); *H01L 31/115* (2013.01)

(58) Field of Classification Search
CPC ................................. G01T 1/201; G01T 1/208
USPC ......................................... 250/361 R, 370.11
See application file for complete search history.

(56) References Cited

U.S. PATENT DOCUMENTS 8,395,127 B1 * 3/2013 Frach .................... G01T 1/2018
250/370.08
2008/0240341 A1 10/2008 Possin et al.
2014/0029715 A1 1/2014 Hansen et al.
(Continued)

FOREIGN PATENT DOCUMENTS

WO 2009090570 A2 7/2009

OTHER PUBLICATIONS

International Search Report and Written Opinion for Corresponding PCT appication PCT/US2016/036021 mailed Sep. 5, 2016; 14 pages.

(Continued)

*Primary Examiner* — David Porta
*Assistant Examiner* — Meenakshi Sahu
(74) *Attorney, Agent, or Firm* — Robert M. McCarthy

(57) ABSTRACT

Embodiments of a solid state photomultiplier are provided herein. In some embodiments, a solid state photomultiplier may include a microcell configured to generate an analog signal when exposed to optical photons, a quench resistor electrically coupled to the microcell in series; and a first switch disposed between the quench resistor and an output of the solid state photomultiplier, the first switch electrically coupled to the microcell via the quench resistor and configured to selectively couple the microcell to the output.

24 Claims, 6 Drawing Sheets

(56) References Cited

U.S. PATENT DOCUMENTS

| | | | |
|---|---|---|---|
| 2015/0110240 A1* | 4/2015 | Morton | G01N 23/046 378/10 |
| 2016/0182902 A1* | 6/2016 | Guo | H04N 5/341 348/301 |
| 2016/0191829 A1* | 6/2016 | Guo | G01T 1/248 348/301 |

OTHER PUBLICATIONS

Yu Zou et al: "Planar CMOS Analog SiPMs: Design, Modeling, and Characterization", Journal of Modem Optics, vol. 62, No. 20, Jun. 2, 2015; pp. 1693-1702.

Dalla Mora A et al: "Single-Photon Avalanche Diode Model for Circuit Simulations", IEEE Photonics Technology Letters, vol. 19, No. 23, Dec. 1, 2007; pp. 1922-1924.

Andrea Gallivanoni et al: "Progress in Quenching Circuits for Single Photon Avalanche Diodes", IEEE Transactions on Nuclear Science, col. 57, No. 6, Dec. 1, 2010; pp. 3815-3826.

Shijie Deng: "Control Circuits for Avalanche Photodiodes", Dec. 1, 2013; 142 pages.

* cited by examiner

SOLID STATE PHOTOMULTIPLIER

CROSS REFERENCE TO RELATED APPLICATION

This patent application claims the benefit of priority, under 35 U.S.C. §119, of U.S. Provisional Patent Application Ser. No. 62/171,291, filed Jun. 5, 2015, titled "MICRO CELL CIRCUITRY FOR HYBRID SIPM" the entire disclosure of which is incorporated herein by reference.

BACKGROUND

The subject matter disclosed herein relates to detection systems for use in imaging systems, such as X-ray based and nuclear medicine imaging systems.

Conventional imaging, for example, such as single photon emission computed tomography (SPECT) and positron emission tomography (PET) may utilize a radiopharmaceutical that is administered to a patient. In the context of PET imaging, the radiopharmaceutical typically breaks down or decays within the patient, releasing a positron that annihilates when encountering an electron and produces a pair of gamma rays moving in opposite directions in the process. In SPECT imaging, a single gamma ray is generated when the radiopharmaceutical breaks down or decays within the patient. These gamma rays interact with detectors within the respective PET or SPECT scanner, which allow the decay events to be localized, thereby providing a view of where the radiopharmaceutical is distributed throughout the patient.

In the above examples of imaging technologies, a detector is employed which converts incident radiation to useful electrical signals that can be used in image formation. Certain such detector technologies employ solid state photomultipliers, which may be useful for detecting optical signals generated in a scintillator in response to the incident radiation. One issue that may arise is that, in certain detector technologies where solid state photomultipliers are employed, the large output capacitance of the solid state photomultipliers combined with the inductance and impedance of the readout circuit can produce poor timing resolution. The larger output capacitance of the solid state photomultiplier arises from the large number of micro cells connected in parallel between the bias voltage input pin and the anode output pin of the solid state photomultiplier. To reduce the output capacitance, circuitry may be added to each microcell to isolate the capacitance of the microcell from the output of the solid state photomultiplier. However, the inventors have observed that conventional circuitry configurations typically require a high current that is drawn from a separate power supply to operate, thereby increasing the power dissipated in the solid state photomultiplier. In addition, the conventional circuitry configurations require relatively large area in the microcell making the photomultiplier inefficient.

Therefore, the inventors have provided an improved solid state photomultiplier.

BRIEF DESCRIPTION

Embodiments of a solid state photomultiplier are provided herein. In some embodiments, a solid state photomultiplier may include a microcell configured to generate an analog signal when exposed to optical photons, a quench resistor electrically coupled to the microcell in series; and a first switch disposed between the quench resistor and an output of the solid state photomultiplier, the first switch electrically coupled to the microcell via the quench resistor and configured to selectively couple the microcell to the output.

In some embodiments, a radiation detector module may include a scintillator layer configured to generate photons in response to incident radiation; and a solid state photomultiplier, comprising: a microcell configured to generate an analog signal when exposed to optical photons, a quench resistor electrically coupled to the microcell in series; and a first switch electrically coupled to the microcell, the first switch configured to selectively couple the microcell to an output of the solid state photomultiplier.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Embodiments of a solid state photomultiplier are provided herein. In at least some embodiments, the inventive solid state photomultiplier may advantageously provide a mechanism to generate an output signal current when a microcell detects a photon and isolating the microcells capacitance from the output circuit when the microcell has not detected a photon while significantly reducing or eliminating high power requirements of previous designs. In addition, in at least some embodiments, the inventive solid state photomultiplier advantageously utilizes an already present current (e.g., discharging current) for creation of the output signal, thereby facilitating generation of the output signal without increasing power requirements of the solid state photomultiplier. Moreover, the inventive solid state photomultiplier may advantageously provide a decrease of intrinsic solid state photomultiplier output capacitance from all not-triggered microcells within the solid state photomultiplier to readout electronics via a switch in an off-state.

Embodiments discussed herein relate to the readout of a detector in a nuclear imaging system, such as a positron emission tomography (PET) or single photon emission computed tomography (SPECT) imaging system or in a combined or hybrid imaging system including such PET or SPECT imaging functionality (e.g., a PET/MR, a PET/CT, or a SPECT/CT imaging system). It should be appreciated, however, that the present SiPM devices may also be employed in other types of imaging modalities or detectors used to detect radiation or nuclear particles, such as radiographic detectors used in X-ray based imaging modalities (e.g., fluoroscopy, mammography, computed tomography (CT), tomosynthesis, angiography, and so forth). However, to simplify explanation, and to facilitate discussion in the context of a concrete example, the present discussion will be provided in the context of a nuclear imaging system.

Figure 1:
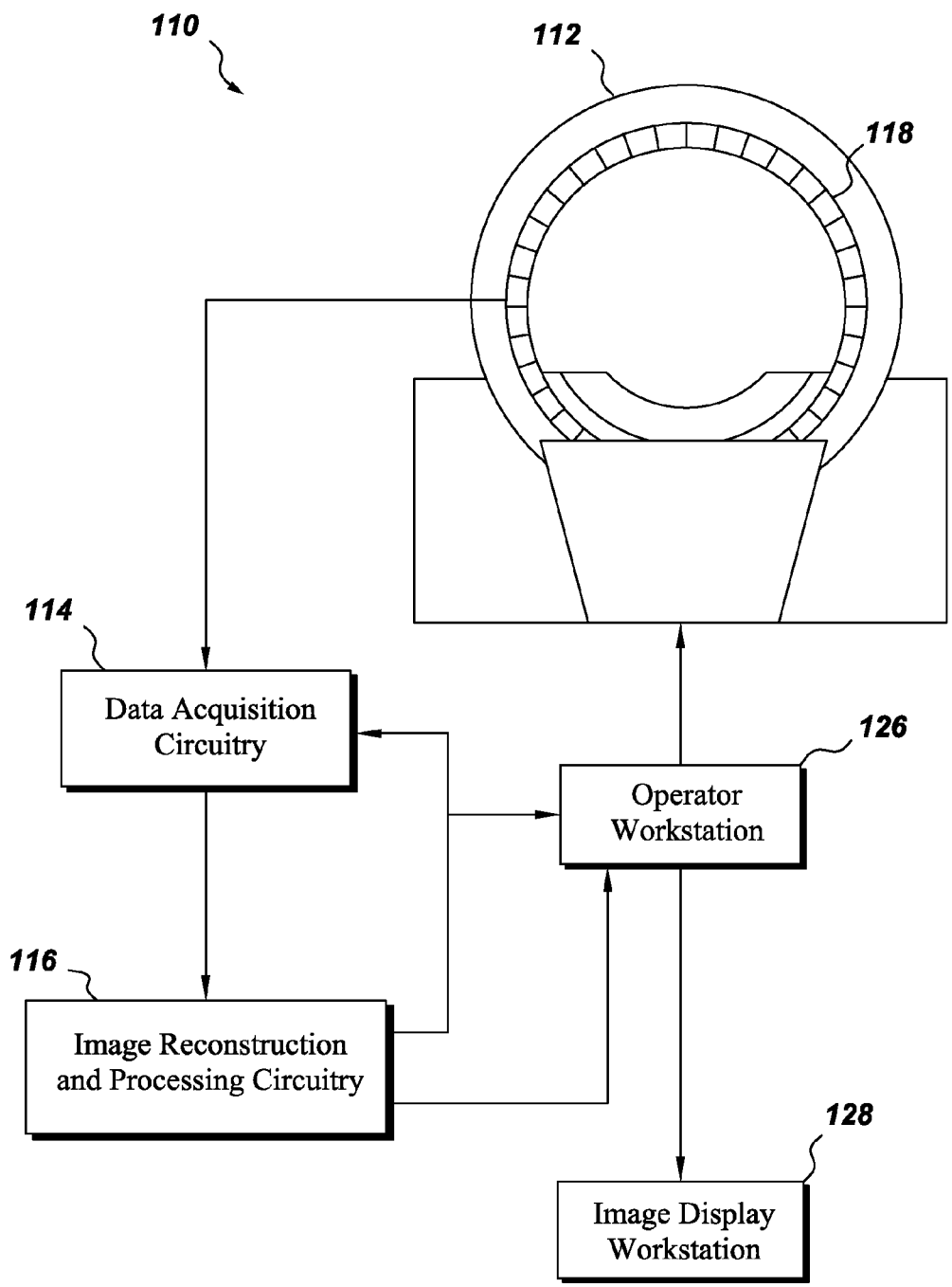
FIG. 1 is a diagrammatical representation of a PET imaging system in accordance with aspects of the present disclosure.

With the foregoing in mind and turning now to the drawings, FIG. 1 depicts a PET system 110 operating in accordance with certain aspects of the present disclosure. Though a PET system 110 is described and discussed herein, it should be appreciated that the present approach may also be useful in other imaging contexts, such as in a SPECT or CT imaging system.

The depicted PET system 110 includes a detector assembly 112, data acquisition circuitry 114, and image reconstruction and processing circuitry 116. The detector assembly 112 of the PET system 110 typically includes a number of detector modules (generally designated by reference numeral 118) arranged about the imaging volume, as depicted in FIG. 1. As discussed herein the detector assembly 112, via the modules 118, may be configured to generate signals in response to gamma rays generated by positron annihilation events and emitted from a subject within the imaged volume. In certain implementations, the detector assembly 112 can include scintillators and photon detection electronics. The detector assembly 112 may be of any suitable construction and configuration for acquiring PET data. For example, as in the depicted example, the detector assembly 112 can be configured as a full or partial ring.

In certain implementations, gamma rays may be converted, such as in a scintillator of the detector assembly 112 or detector modules 118, to lower energy photons that in turn may be detected and converted in the detector modules 118 to electrical signals, which can be conditioned and processed to output digital signals. In certain imaging applications, to overcome the low number of optical photons generated in response to impinging radiation at the scintillator (i.e., the low signal level), a solid state photomultiplier (e.g., a silicon photomultiplier (SiPM)) may be combined with a scintillator to provide amplification of the signals.

The signals generated by the detector modules 118 can be used to match pairs of gamma ray detections as potential coincidence events. That is, in a PET implementation, when two gamma rays strike opposing detectors it may be determined that a positron annihilation occurred somewhere on the line connecting the two impact locations (absent the effects of interactions of randoms and scatter detections). In SPECT implementations, line of flight information may instead be inferred based at least in part on the collimation associated with the detector assembly. The collected data can be sorted and integrated and used in subsequent processing such as by image reconstruction and processing circuitry 116.

Thus, in operation, the detector acquisition circuitry 114 is used to read out the signals from the detector modules 118 of the detector assembly 112, where the signals are generated in response to gamma rays emitted within the imaged volume. The signals acquired by the detector acquisition circuitry 114 are provided to the image reconstruction and processing circuitry 116. The image reconstruction and processing circuitry 16 generates an image based on the derived gamma ray emission locations. The operator workstation 126 is utilized by a system operator to provide control instructions to some or all of the described components and for configuring the various operating parameters that aid in data acquisition and image generation. The operating workstation 126 may also display the generated image. Alternatively, the generated image may be displayed at a remote viewing workstation, such as the image display workstation 128.

It should be appreciated that, to facilitate explanation and discussion of the operation of the PET system 110, the detector acquisition circuitry 114 and the image reconstruction and processing circuitry 116 have been shown separately in FIG. 1 from other illustrated components (e.g., the detector assembly 112, the operator workstation 126, and the image display workstation 128). However, it should be appreciated that, in certain implementations, some or all of these circuitries may be provided as part of the detector assembly 112, the operator workstation 126, and/or the image display workstation 128. For example, the hardware, software, and/or firmware executed on or provided as part of the data acquisition circuitry 114, whether provided as part of the detector assembly 112, the operator workstation 126, and/or the image display workstation 128, may be used to perform various detector readout and/or control actions described herein. In certain implementations the data acquisition circuitry 114 may include specially configured or programmed hardware, memory, or processors (e.g., application-specific integrated circuits (ASICs)) for performing detector readout steps as discussed herein. Similarly, certain of these readout functions may be performed using one or more general or special purpose processors and stored code or algorithms configured to execute on such processors. Likewise, a combination of special purpose hardware and/or circuitry may be used in conjunction with one or more processors configured to execute stored code to implement the steps discussed herein.

With the preceding mind, the detector technology in one implementation of a system such as that depicted in FIG. 1 will be discussed in greater detail. In particular, a PET or SPECT system may utilize arrays of solid-state photo multiplier (e.g., silicon photomultiplier (SiPM)) devices as part of the gamma ray detection mechanism, such as within detector modules 118. Such SiPM devices may take the form, in certain implementations, of an array of microcells (e.g., passively quenched Geiger-mode avalanche photodiodes (APD)) for detecting impinging photons. In general, SiPM devices used for photon detection can provide information about certain parameters, such as the time of the impingement event, the energy associated with the event, and the position of the event within the detector. These parameters can be determined through processing algorithms applied to the output signals generated by the SiPM.

In one embodiment, a multichannel readout front-end application-specific integrated circuit (ASIC) interfaces with an array of SiPMs in a PET (or SPECT) system. The ASIC may be provided as part of the data acquisition circuitry 114 of FIG. 1 and may be configured to provide information on the timing, energy, and location of events in each SiPM to a processing system (e.g., processing circuitry 116), as well as the ability to bias each SiPM.

Figure 2:
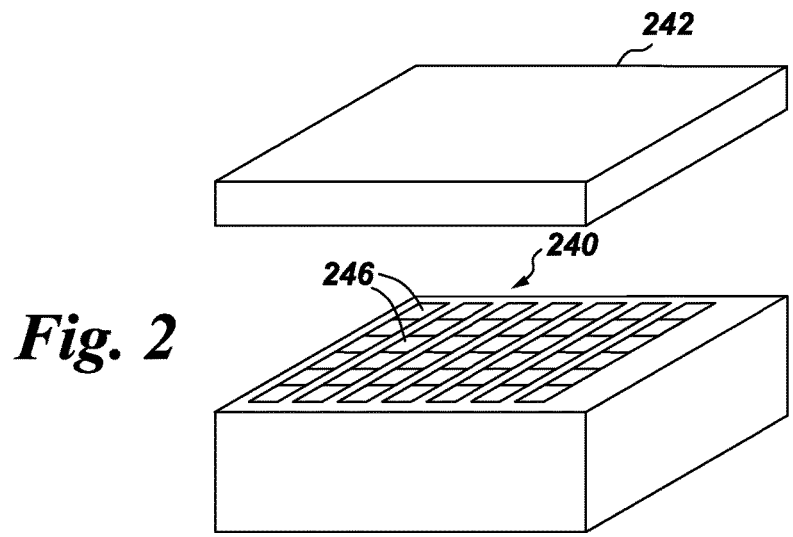
FIG. 2 depicts a perspective view of a detector element, in accordance with aspects of the present disclosure.

As depicted in FIG. 2, a single SiPM pixel 240 is comprised of a plurality of avalanche photodiodes (APDs) or "microcells" 246 that amplify single optical photon arrivals from the scintillator 242 into an output signal. Typically, each SiPM 240 will contain a large number of microcells 246 (e.g., between 100 to 2,500 APDs per $mm^2$). In certain embodiments, each of the microcells 246 may have a length of between 20 microns to 100 microns. In one implementation, each of the microcells 246 operates as an individual Geiger-mode APD a few volts above a breakdown voltage, with each microcell 246 being virtually identical to all the other microcells. In this mode of operation, an electron generated by the absorption of an optical photon initiates an avalanche breakdown that is confined to an individual microcell 246 when the one or more photons are absorbed by that microcell 246.

Each microcell 246 functions independently of the others to detect photons. A single discrete unit of electrical charge is emitted from the microcell 246 independent of the number of photons absorbed therein. That is, for each Geiger breakdown, the output signal of the microcell 246 will have substantially the same shape and charge. In one embodiment, the microcells are electrically connected in parallel to yield an integrated charge over some area over which the signals are being aggregated, such as a SiPM 240. The summed discharge currents of the microcells 246 are indicative of the incidence of radiation over a given area. This quasi-analog output is capable of providing magnitude information regarding the incident photon flux over the area for which signals are being aggregated.

Figure 3:
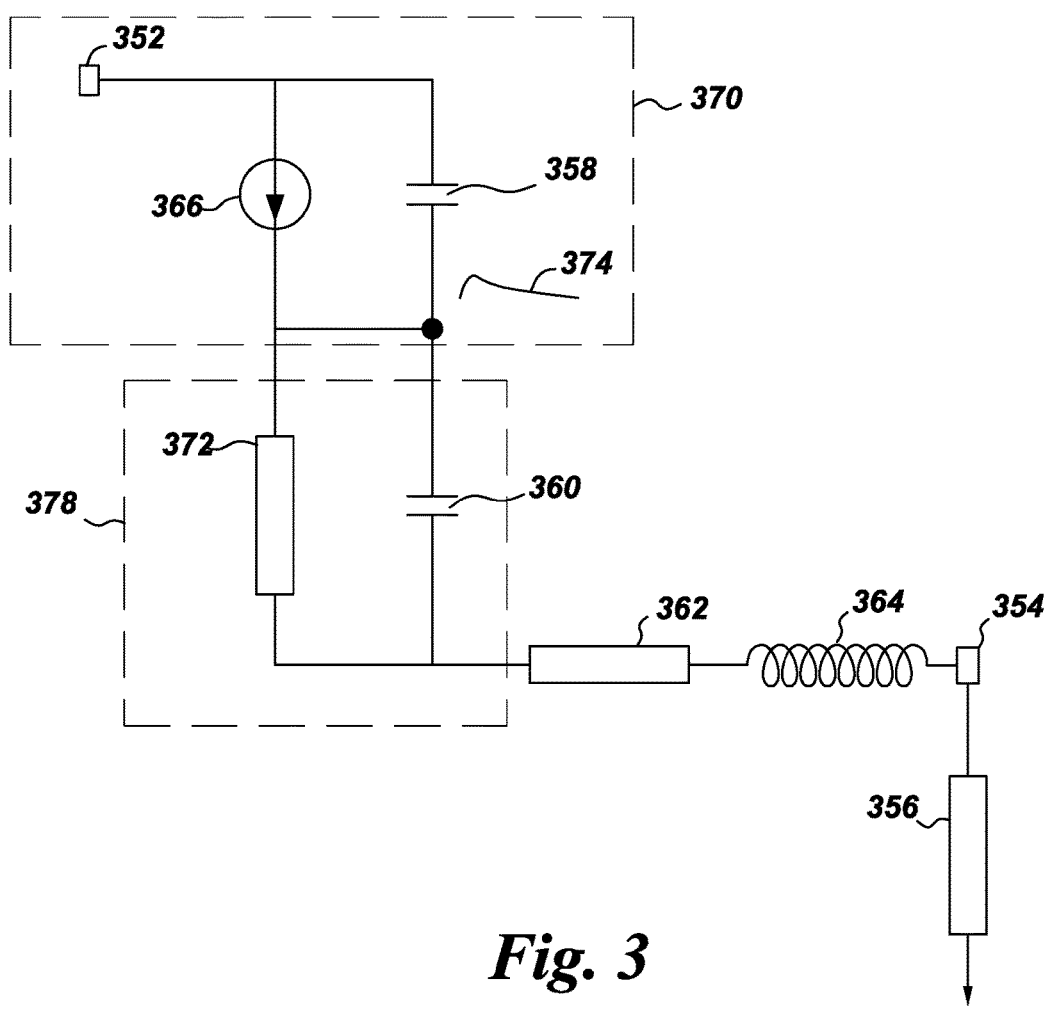
FIG. 3 depicts an electrical schematic of a microcell signal generating path.

Turning to FIG. 3, an example of a simplified electrical model of a microcell is depicted where the microcell is one of a plurality of microcells within an SiPM array of such cells. In one example, the depicted microcell may include, or be part of, an array of avalanche photodiodes (e.g., single photon avalanche diodes (SPAD)) operated in Geiger mode. In the depicted example, the model has an associated cathode 352 and anode 354 and downstream load 356. The microcell portion 370 of the model includes a diode capacitor 358 and a current pulse 366, such as may be associated with a photodiode. Quench circuitry 378 in the depicted example includes a quench resistor 372 and a parasitic quench capacitor 360. Downstream of the quench circuitry 378, in this example, a parasitic resistor 362 and parasitic inductor 364 are modeled.

In this model each individual APD of a microcell 370, such as the depicted microcell, is connected to a readout network via the quenching circuitry 378, including the quenching resistor ($R_q$) 372 with typical values between about 100 kΩ to about 1 MΩ. When a detected photon generates an avalanche event, a pulse current 366 is generated and the microcell diode capacitance $C_d$ 358 discharges down to the breakdown voltage and the recharging current creates a measureable output signal. The typical pulse shape 374 of a single photo electron (SPE) signal has fast rise time (i.e., a sharp rising edge) followed by a long fall time (i.e., a slow falling tail).

Figure 4:
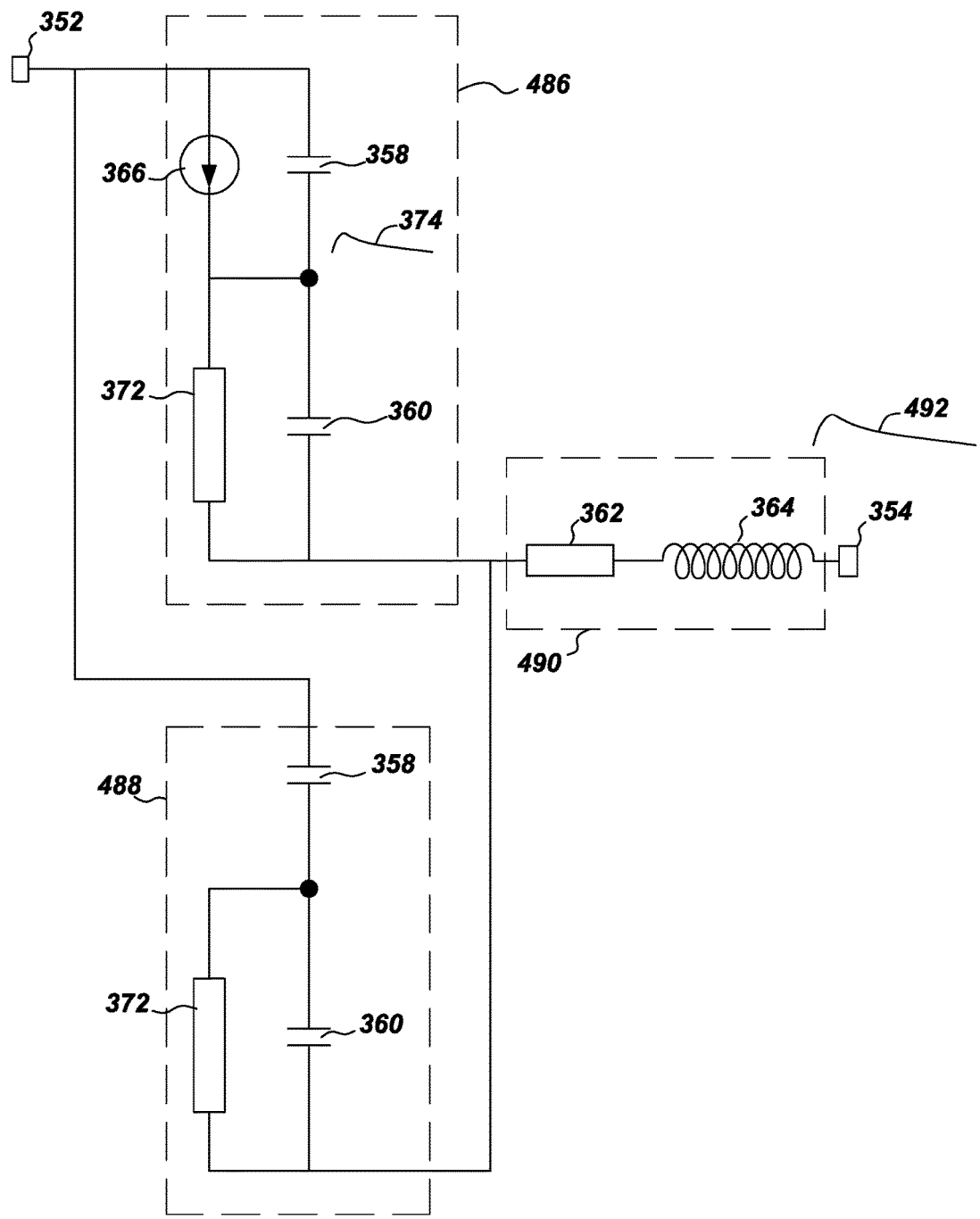
FIG. 4 depicts an example of signal summing using analog microcell signals.

Turning to FIG. 4, the analog pulses 374 are output for summing, such as over a SiPM pixel. In FIG. 4, summing is depicted over a number of microcells, which for a given summing event, may include both firing microcells 486 as well as non-firing microcells 488 (for which no signal 374 is output). In the depicted example, the aggregation of the output signal 492 may be subject to circuit parasitics 490 (e.g., parasitic resistor 362 and/or parasitic inductor 364) which in combination with the large output capacitance of the devices will reduce the rise time of the output pulse, which yields poor time resolution.

Conventional SiPMs may include electronic circuitry incorporated into the circuit for each microcell (e.g., microcell 246) during fabrication of the SiPM 40. This circuitry detects the avalanche development and generates a short digital pulse in the readout network (e.g., a "one-shot"). The circuitry may include, for example, a digital one-shot pulse generator coupled to a comparator, wherein the digital one-shot pulse generator is triggered in response to the output of the comparator. When present, the digital one-shot pulse generator generates a short duration (e.g., approximately 1 ns or less) digital pulse for summing over some area (e.g., at the SiPM level) instead of summing the analog pulses conventionally provided as output. As will be appreciated, the amplitude and duration of the digital pulse are fixed by design. This is in contrast to analog pulses, such as pulse where the amplitude of the analog pulse depends in part on $V_{br}$ which is sensitive to temperature. As a result, the summed, or otherwise aggregated, digital pulses provide a signal output having a short rise time (as opposed to the summed analog signals) with reduced rise time associated with scintillator pulses. However, the inventors have observed that the above described one-shot pulse generation requires a significant amount of power, requiring a high current that is drawn from a power supply to operate, thereby increasing the power dissipated in the solid state photomultiplier. In addition, to produce a pulse with a fast rise time, a method of storing charge near the microcell (for example a capacitor) must be provided to enable the large current required during the pulse, thus increasing the space required for the electronics and reducing the efficiency of the solid state photo multiplier.

Figure 5:
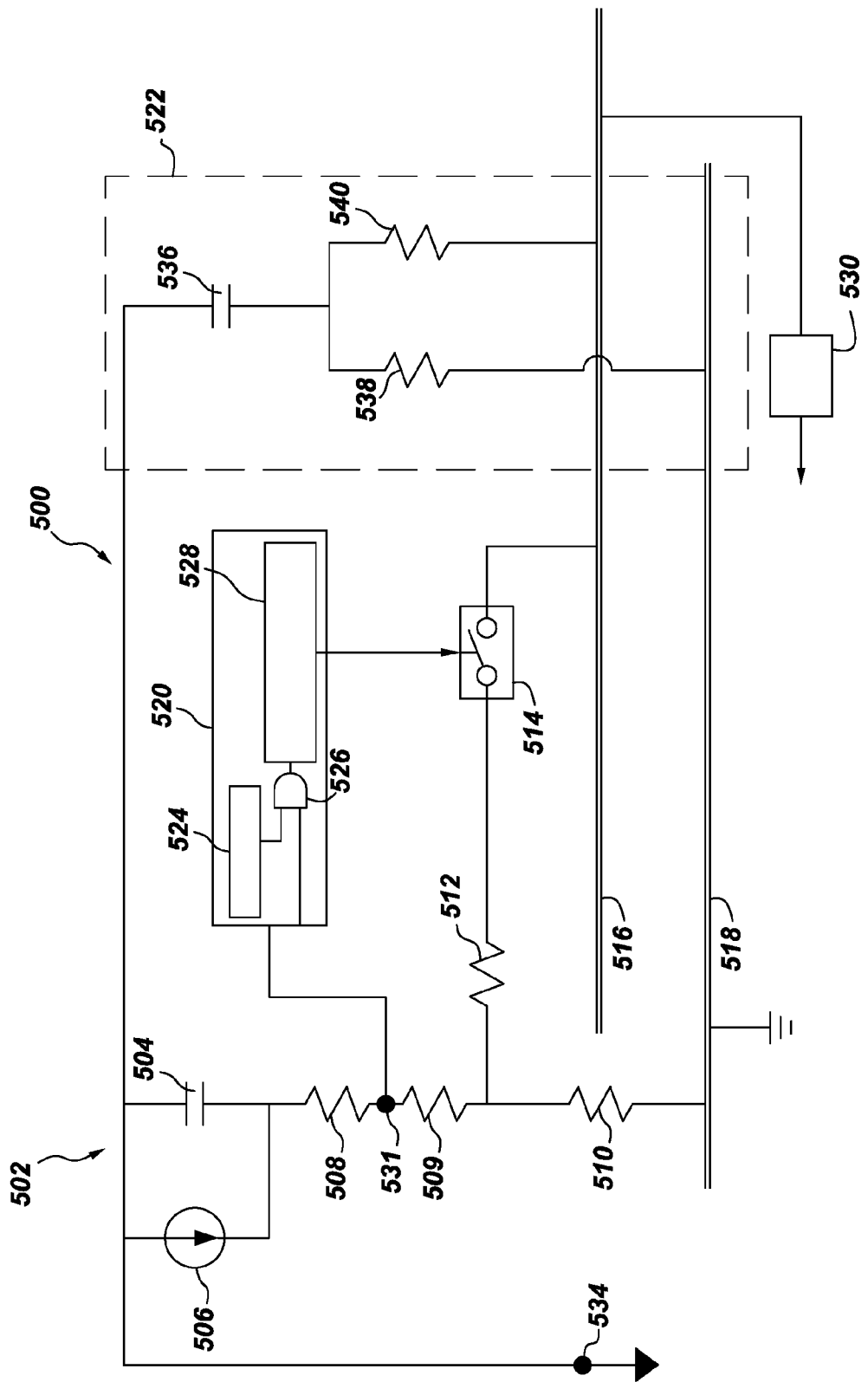
FIG. 5 depicts an electrical schematic of at least a portion of a solid state photomultiplier in accordance with some embodiments of the present invention.

As such, referring to FIG. 5, in some embodiments, the solid state photomultiplier 500 (e.g., a silicon photomultiplier (SiPM)) may include a plurality of microcells (two microcells 502, 522 shown), a plurality of quench resistors (e.g., quench resistors 508, 509, 510, 538, 540 shown) and a plurality of first switches (one first switch 514 shown) coupling the plurality of microcells 502, 522 to an output 530. In an exemplary operation, upon detection of a discharge current (e.g., a Geiger mode discharge current) at a predetermined threshold from a specific microcell (e.g., an "active" microcell) the first switch 514 coupling the respective active microcell to the output 530 is triggered or actuated to an "on" position, thereby selectively coupling the active microcell to the output 530 and directing the discharge current to the output 530. Upon reaching a predetermined current threshold, the first switch 514 is then triggered or actuated to an "off" position, thus decoupling the active microcell from the output 530. Thus, the implementation of the solid state photomultiplier (SiPM) 500 as described herein advantageously allows for the utilization of an already existing current (e.g., the discharge current) within the SiPM 500 to generate the output signal or "one shot" pulse without increasing the SiPM power, thereby reducing or eliminating high power requirements typically required in conventional SiPM configurations. Moreover, the inventive SiPM 500 may further advantageously provide a significant decrease of intrinsic SiPM output capacitance via the decoupling of all not-triggered micro cells to read out output via switch in off-state.

In some embodiments, each of the microcells 502, 522 may be coupled to an associated anode (e.g., anode 534) and a downstream load (e.g., output or readout electronics 530). The plurality of microcells 502, 522 may be coupled to the output 530 via a first bus (readout bus) 516 and coupled to a quench mechanism (e.g., ground) via a second bus (quench bus) 518.

The microcells 502, 522 are each configured to generate an analog signal when exposed to optical photons (e.g., as described above). To this end, the microcells 502, 522 may be configured in any manner suitable to provide the desired functionality, for example, such as the microcells 370, 486, 488 described above. Although only two microcells 502, 522 are shown, any number of microcells may be present within the SiPM 500. The microcells may be configured similarly, or in some embodiments, microcell configurations may vary within the SiPM 500. For example, microcell 522 is shown as representative of additional microcells that may be included in the SiPM 500 and may include the same or similar components (e.g., capacitor 536, quench resistor 538 and readout resistor 540 shown) as shown in microcell 502. In addition, microcell 522 may be coupled to a switch (e.g., first switch 514 or another switch not shown) and/or sensing circuitry (e.g., sensing circuitry 520 or other sensing circuitry not shown). For clarity the below exemplary embodiments will be described in the context of a single microcell, however, it is to be understood that a plurality of the exemplary microcell may be included in the inventive SiPM 500.

Referring to microcell 502, or an exemplary "active" microcell, in some embodiments, the microcell 502 may include a diode capacitor 504 and a current pulse 506, such as may be associated with a photodiode. The microcell 502 may further include a plurality of quench resistors connected in series, for example a first quench resistor 508 ($R_{q1}$), a second quench resistor 509 ($R_{q2}$), and a third quench resistor 510 ($R_{q3}$). When present, the first quench resistor 508 ($R_{q1}$) and second quench resistor 509 ($R_{q2}$) may be coupled to one another via a common node (sensing node) 531. In some embodiments, the first quench resistor 508 ($R_{q1}$) and/or the second quench resistor 510 ($R_{q2}$) may be implemented as active, or in some embodiments, passive components.

In some embodiments, the first switch 514 is coupled to the common node 532 and controls the flow of current from the microcell 502 to the output (readout electronics) 530. In some embodiments, the first switch 514 may be coupled to the output 530 via the first bus (readout bus) 516. The first switch 514 may be any type of switch for example, a gate of a solid state or semiconductor (e.g., a MOSFET, IGBT, or the like) switch, or the like. In some embodiments, actuation of the first switch 514 may be controlled by a comparator 526 (described below).

In some embodiments, an additional resistor (resistor) 512 is disposed between the common node 531 and first switch 514, coupling the common node 531 to the first switch 514 (via second quench resistor 509 ($R_{q2}$) when present). When present, the resistor 512 is coupled to the first switch 514 in series and functions to limit current flowing from the microcell 502 to the first switch 514, thereby allowing the SiPM 500 to be operated at an over voltage value that is higher than a voltage capacity of the microcell circuitry.

In some embodiments, resistor 508 is essentially zero resistance (i.e. removed) connecting the sensing node 531 directly to the diode. Quenching resistor 509 may have a resistance of about 100 kΩ to about 1 MΩ and resistors 510 and 512 may have resistances between of about 10 Ω to about 10 kΩ.

In some embodiments, resistors 510 and 512 may have resistances of about 10 Ω to about 10 kΩ and quench resistors 508 and 509 resistors may have a resistance of about 50 kΩ to about 1 MΩ. The ratio of the resistances of resistors 508 and 509 may be chosen such that maximum voltage at sensing point 509 is always less than the save voltage for operating the trigger 526, thereby allowing the SiPM 500 to be operated at an over voltage value that is higher than a voltage capacity of the microcell circuitry.

Each of the first quench resistor 508, second quench resistor 510 and resistor 512 may have any resistance suitable to provide a desired functionality of the SiPM 500. For example, in some embodiments, the first quench resistor 508 and second quench resistor 509 may each have a resistance of about 100 kΩ to about 1 MΩ, or in some embodiments, about 180 kΩ. In such embodiments, the additional resistor 512 may have a resistance of about 100 kΩ to about 1 MΩ, or in some embodiments, about 200 kΩ. In some embodiments, a ratio of the resistances of each of the first quench resistor 508, second quench resistor 509, and third quench resistor 510 and resistor 512 may be adjusted to achieve a desired voltage at an input of comparator and collected signal current amplitude and duration.

In some embodiments, sensing circuitry 520 is connected to the common node 531 and controls operation of the first switch 514. The sensing circuitry 520 may be configured in any manner suitable to provide the desired operation of the first switch 514. For example, in some embodiments, the sensing circuitry 520 may include a comparator 526 and/or a logic unit 528, or the like. When present, the logic unit 528 functions to determine a delay and/or a length of time the switch 514 is maintained in an "on" or "off" state.

In operation, the sensing circuitry 520 observes or senses a voltage at the common node 531, wherein the voltage is attenuated by a factor defined by $R_{q1}/(R_{q1}+R_{q2}+R_{q3})$. When the sensed voltage reaches a threshold voltage ($V_{th}$) 524 the comparator 526 causes the first switch 514 to be actuated or triggered to an "on" state, thereby allowing a current from the microcell 502 (e.g., current discharge as a result of an avalanche event of an avalanche photodiode (APD)) 502 to flow to the output 530. As the APD recharges and the sensed voltage decreases below the threshold voltage ($V_{th}$) 524, the first switch 514 is actuated or triggered to an "off" state, thereby decoupling the microcell 502 from output 530.

Figure 6:
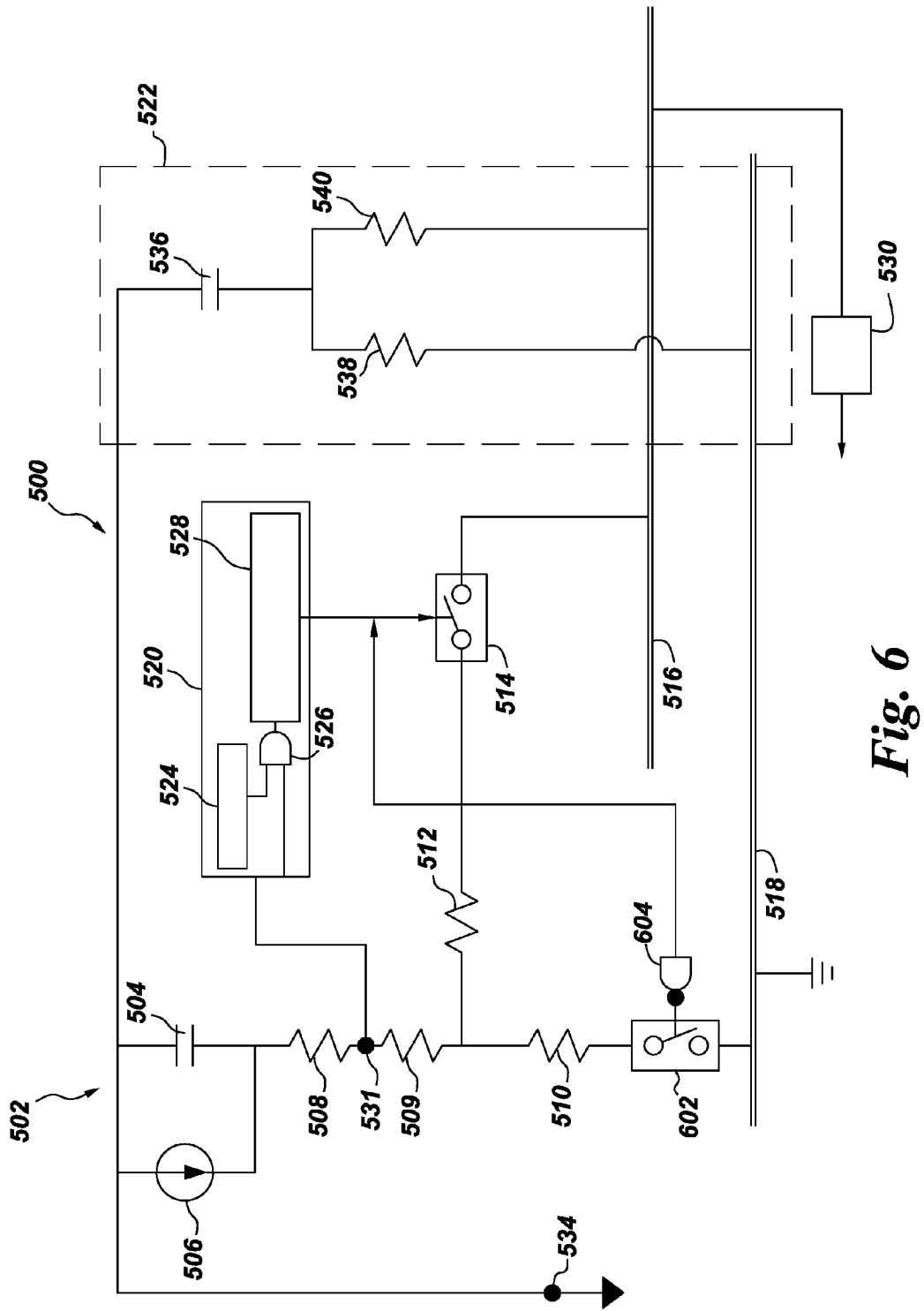
FIG. 6 depicts an electrical schematic of at least a portion of a solid state photomultiplier in accordance with some embodiments of the present invention.

Referring to FIG. 6, in some embodiments, the SiPM 500 may comprise a second switch 602 configured to selectively couple the microcell 502 to a quenching mechanism (e.g., ground via second bus 518 as shown in the figure). In such embodiments, a comparator 604 may be coupled to the second switch 602 and configured to control actuation (e.g., coupled to a gate) of the switch. In some embodiments, the comparator 604 may function to maintain each of the first switch 514 and second switch 602 in opposing states (e.g., the first switch 514 in an "on" state and the second switch 602 in an "off" state or the first switch 514 in an "off" state and second switch 602 in an "on" state). In such embodiments, the sensing circuitry 520 may function to control the comparator 604.

In operation, the sensing circuitry 520 observes or senses a voltage at the common node 531 as described above. When the sensed voltage reaches a threshold voltage ($V_{th}$) 524 the sensing circuitry 520 signals the comparator 526 to cause the first switch 514 to be in an "on" state and the second switch 602 to be in an "off" state thereby allowing a current from the microcell 502 (e.g., current discharge as a result of an avalanche event of an avalanche photodiode (APD)) 502 to flow to the output 530. As the APD recharges and the sensed voltage decreases below the threshold voltage ($V_{th}$) 524, the sensing circuitry 520 signals the comparator 526 to cause the first switch 514 to be in an "off" state and the second switch 602 to be in an "on" state, thereby decoupling the microcell 502 from output 530 and coupling the microcell 502 to ground.

Figure 7:
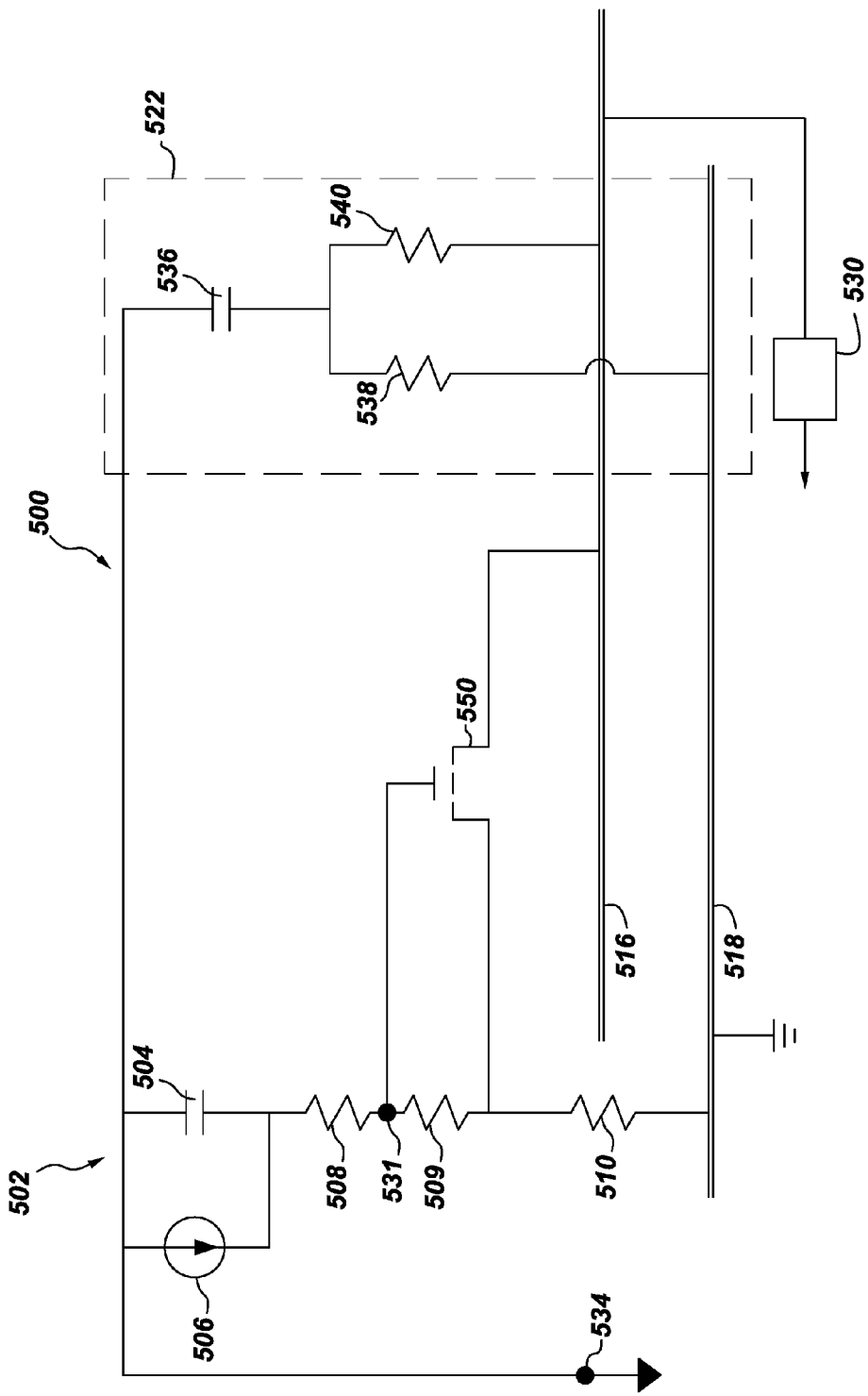
FIG. 7 depicts an electrical schematic of at least a portion of a solid state photomultiplier in accordance with some embodiments of the present invention.

Referring to FIG. 7, in some embodiments, the functionality of the sensing circuit 520 can be included in a nMOS switch 514 that has been constructed such that its transition from a large off resistance to a low on resistance occurs at a positive voltage. In such embodiments, when the sensed voltage 531 reaches the transition voltage of switch 514, the resistance thru switch 514 will decrease allowing a current from the microcell 502 (e.g., current discharge as a result of an avalanche event of an avalanche photodiode (APD)) 502 to flow to the output 530. As the APD recharges and the sensed voltage decreases below the transition voltage of switch 514, the resistance will increase, thereby decoupling the microcell 502 from output 530.

Thus, embodiments of a solid state photomultiplier are provided herein. This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A solid state photomultiplier, comprising:
   a microcell configured to generate an analog signal when exposed to optical photons,
   a quench resistor electrically coupled to the microcell in series; and
   a first switch disposed between the quench resistor and an output of the solid state photomultiplier, the first switch electrically coupled to the microcell via the quench resistor and configured to selectively couple the microcell to the output.

2. The solid state photomultiplier of claim 1, wherein the microcell comprises a plurality of microcells, the quench resistor comprises a plurality of quench resistors respectively electrically coupled to the plurality of microcells, and the first switch comprises a plurality of first switches respectively electrically coupled to the plurality of microcells, wherein the plurality of first switches are configured to selectively electrically couple one or more active microcells of the plurality of microcells to the output.

3. The solid state photomultiplier of claim 2, further comprising:
   a first bus electrically coupling the plurality of microcells to the output; and
   a second bus electrically coupling the plurality of microcells to quenching mechanism.

4. The solid state photomultiplier of claim 1, wherein the output is coupled to readout electronics.

5. The solid state photomultiplier of claim 1, wherein the microcell comprises an avalanche photodiode operating in Geiger mode.

6. The solid state photomultiplier of claim 1, wherein the first switch is a gate of a semiconductor device.

7. The solid state photomultiplier of claim 1, further comprising a comparator coupled to the first switch, wherein the comparator controls operation of the first switch.

8. The solid state photomultiplier of claim 1, further comprising:
   a second switch disposed between the quench resistor and a quenching mechanism of the solid state photomultiplier, the second switch electrically coupled to the microcell via the quench resistor and configured to selectively couple the microcell to the quenching mechanism.

9. The solid state photomultiplier of claim 8, further comprising a comparator coupled to the first switch and the second switch, wherein the comparator controls the first switch and the second switch such that either the first switch is open and the second switch is closed or the first switch is closed and the second switch is open.

10. The solid state photomultiplier of claim 1, wherein the quench resistor comprises a first quench resistor and a second quench resistor coupled to one another in series via a common node disposed between the two quench resistors, and wherein the first switch is coupled to the common node.

11. The solid state photomultiplier of claim 10, wherein the quench resistor further comprises a third quench resistor disposed between the second quench resistor and a quenching mechanism.

12. The solid state photomultiplier of claim 10, further comprising a resistor disposed between the second resistor and the first switch and coupling the second resistor to the first switch.

13. The solid state photomultiplier of claim 10, further comprising sensing circuitry coupled to the common node, the sensing circuitry configured to control operation of the switch upon sensing of a predetermined threshold voltage at the common node.

14. The solid state photomultiplier of claim 13, wherein the sensing circuitry comprises a logic unit configured to control at least one of a delay or length of time the first switch is maintained in an on or off state.

15. The solid state photomultiplier of claim 13, wherein the sensing circuitry and the switch are formed from an nMOS switch.

16. A radiation detector module, comprising:
   a scintillator layer configured to generate photons in response to incident radiation; and
   a solid state photomultiplier, comprising:
   a microcell configured to generate an analog signal when exposed to optical photons,
   a quench resistor electrically coupled to the microcell in series; and
   a first switch electrically coupled to the microcell, the first switch configured to selectively couple the microcell to an output of the solid state photomultiplier.

17. The radiation detector module of claim 16, wherein the microcell comprises a plurality of microcells, the quench resistor comprises a plurality of quench resistors respectively electrically coupled to the plurality of microcells, and the first switch comprises a plurality of first switches respectively electrically coupled to the plurality of microcells, wherein the plurality of first switches are configured to selectively electrically couple one or more active microcells of the plurality of microcells to the output, and wherein the solid state photomultiplier further comprises:
   a first bus electrically coupling the plurality of microcells to the output; and
   a second bus electrically coupling the plurality of microcells to quenching mechanism.

18. The radiation detector module of claim 17, further comprising:
   a second switch disposed between the quench resistor and a quenching mechanism of the solid state photomultiplier, the second switch electrically coupled to the microcell via the quench resistor and configured to selectively couple the microcell to the quenching mechanism.

19. The radiation detector module of claim 18, further comprising a comparator coupled to the first switch and the second switch, wherein the comparator controls the first switch and the second switch such that either the first switch is open and the second switch is closed or the first switch is closed and the second switch is open.

20. The radiation detector module of claim 16, wherein the quench resistor comprises a first quench resistor and a second quench resistor coupled to one another in series via a common node disposed between the two quench resistors, and wherein the first switch is coupled to the common node.

21. The radiation detector module of claim 20, wherein the quench resistor further comprises a third quench resistor disposed between the second quench resistor and a quenching mechanism.

22. The radiation detector module of claim 20, further comprising a resistor disposed between the second resistor and the first switch and coupling the second resistor to the first switch.

23. The radiation detector module of claim 20, further comprising sensing circuitry coupled to the common node, the sensing circuitry configured to control operation of the switch upon sensing of a predetermined threshold voltage at the common node.

24. The radiation detector module of claim 23, wherein the sensing circuitry and the switch are formed from an nMOS switch.

\* \* \* \* \*